(12) United States Patent
Sin et al.

(10) Patent No.: US 9,287,344 B2
(45) Date of Patent: Mar. 15, 2016

(54) MONOLITHIC MAGNETIC INDUCTION DEVICE

(75) Inventors: Johnny Kin On Sin, Hong Kong (CN); Rongxiang Wu, Hong Kong (CN); Ron Shu Yuen Hui, Hong Kong (CN)

(73) Assignee: THE HONG KONG UNIVERSITY OF SCIENCE AND TECHNOLOGY, Hong Kong (CN)

( * ) Notice: Subject to any disclaimer, the term of this patent is extended or adjusted under 35 U.S.C. 154(b) by 700 days.

(21) Appl. No.: 13/215,350

(22) Filed: Aug. 23, 2011

(65) Prior Publication Data

US 2012/0068301 A1    Mar. 22, 2012

Related U.S. Application Data

(60) Provisional application No. 61/344,566, filed on Aug. 23, 2010.

(51) Int. Cl.
| | |
|---|---|
| *H01F 27/28* | (2006.01) |
| *H01L 49/02* | (2006.01) |
| *H01L 23/64* | (2006.01) |
| *H01L 27/04* | (2006.01) |

(52) U.S. Cl.
CPC .............. *H01L 28/10* (2013.01); *H01F 27/28* (2013.01); *H01L 23/645* (2013.01); *H01L 2924/0002* (2013.01)

(58) Field of Classification Search
CPC ... H01F 41/042; H01F 27/28; H01F 27/2804; H01F 27/2809; H01F 27/2819; H01F 5/003; H01F 17/0013; H01F 17/0006; H01F 2017/0086
See application file for complete search history.

(56) References Cited

U.S. PATENT DOCUMENTS

| | | | | |
|---|---|---|---|---|
| 3,881,244 | A | * | 5/1975 | Kendall ..................... 29/602.1 |
| 4,318,148 | A | * | 3/1982 | Kaminaka et al. ....... 360/125.01 |
| 4,416,056 | A | * | 11/1983 | Takahashi .................. 29/603.24 |
| 5,095,357 | A | * | 3/1992 | Andoh et al. .................. 257/379 |
| 5,519,582 | A | | 5/1996 | Matsuzaki |

(Continued)

OTHER PUBLICATIONS

Prabhakaran et al., "Microfabricated V-groove power inductors for high-current low-voltage fast-transient DC-DC converters", Proceedings of Power Electronics Speicalists Conference, Recife, Brazil, pp. 1513-1519, Jun. 2005.

(Continued)

*Primary Examiner* — William F Kraig
*Assistant Examiner* — Maliheh Malek
(74) *Attorney, Agent, or Firm* — Amin, Turocy & Watson, LLP

(57) ABSTRACT

Providing for a monolithic magnetic induction device having low DC resistance and small surface area is described herein. By way of example, the magnetic induction device can comprise a substrate (e.g., a semiconductor substrate) having trenches formed in a bottom layer of the substrate, and holes formed in the substrate between the trenches and an upper layer of the substrate. Additionally, the magnetic induction device can comprise a conductive coil embedded or deposited within the trenches. The magnetic induction device can further comprise a set of conductive vias formed in the holes that electrically connect the bottom layer of the substrate with the upper layer. Further, one or more integrated circuit components, such as active devices, can be formed in the upper layer, at least in part above the conductive coil. The vias can be utilized to connect to integrated circuit components with the conductive coil, where suitable.

41 Claims, 11 Drawing Sheets

(56) References Cited

U.S. PATENT DOCUMENTS

| | | | | |
|---|---|---|---|---|
| 5,610,433 | A * | 3/1997 | Merrill et al. | 257/531 |
| 6,191,918 | B1 * | 2/2001 | Clarke et al. | 360/125.43 |
| 6,204,997 | B1 * | 3/2001 | Sasaki | 360/123.39 |
| 6,246,541 | B1 * | 6/2001 | Furuichi et al. | 360/125.54 |
| 6,281,778 | B1 * | 8/2001 | El-Sharawy et al. | 336/200 |
| 6,380,608 | B1 * | 4/2002 | Bentley | 257/531 |
| 6,429,504 | B1 * | 8/2002 | Beaussart et al. | 257/531 |
| 6,429,764 | B1 * | 8/2002 | Karam et al. | 336/200 |
| 6,462,915 | B1 * | 10/2002 | Sasaki | 360/317 |
| 6,515,826 | B1 * | 2/2003 | Hsiao et al. | 360/123.45 |
| 6,542,339 | B1 * | 4/2003 | Sasaki et al. | 360/317 |
| 6,557,241 | B1 * | 5/2003 | Sasaki | 29/603.12 |
| 6,580,334 | B2 * | 6/2003 | Simbürger et al. | 333/24 R |
| 6,611,035 | B2 * | 8/2003 | Inoue | 257/421 |
| 6,650,220 | B2 * | 11/2003 | Sia et al. | 336/200 |
| 6,830,970 | B2 | 12/2004 | Gardes | |
| 6,927,662 | B2 | 8/2005 | Kahlmann et al. | |
| 7,262,680 | B2 * | 8/2007 | Wang | 336/200 |
| 7,400,025 | B2 * | 7/2008 | Pitts et al. | 257/531 |
| 7,404,249 | B2 | 7/2008 | Gardes et al. | |
| 7,408,434 | B2 * | 8/2008 | Lee | H01F 17/0006 336/200 |
| 7,436,683 | B2 * | 10/2008 | Shen | 361/801 |
| 7,531,407 | B2 | 5/2009 | Clevenger et al. | |
| 7,598,098 | B2 * | 10/2009 | Lerner | 438/7 |
| 7,667,566 | B2 * | 2/2010 | Hsu et al. | 336/200 |
| 7,952,160 | B2 * | 5/2011 | Triantafillou et al. | 257/499 |
| 7,963,021 | B2 * | 6/2011 | Lee | H01F 17/0006 29/602.1 |
| 7,978,043 | B2 * | 7/2011 | Nabeshima et al. | 336/200 |
| 8,143,987 | B2 * | 3/2012 | Kireev | 336/200 |
| 8,339,233 | B2 * | 12/2012 | Tsai et al. | 336/200 |
| 8,810,352 | B2 * | 8/2014 | Yokoyama et al. | 336/200 |
| 2001/0009491 | A1 * | 7/2001 | Sasaki | 360/318 |
| 2002/0067570 | A1 * | 6/2002 | Sasaki et al. | 360/126 |
| 2002/0093772 | A1 * | 7/2002 | Yoshida et al. | 360/317 |
| 2004/0149585 | A1 * | 8/2004 | Wong | 205/118 |
| 2004/0246692 | A1 * | 12/2004 | Satoh et al. | 361/782 |
| 2005/0068674 | A1 * | 3/2005 | Ogawa et al. | 360/126 |
| 2005/0190035 | A1 * | 9/2005 | Wang | 336/200 |
| 2005/0275497 | A1 * | 12/2005 | Ramadan et al. | 336/200 |
| 2009/0039999 | A1 * | 2/2009 | Fujii et al. | 336/200 |
| 2009/0094818 | A1 * | 4/2009 | Smeys et al. | 29/602.1 |
| 2009/0261897 | A1 * | 10/2009 | Bobde | 327/552 |
| 2010/0020509 | A1 | 1/2010 | Xie et al. | |
| 2010/0225436 | A1 * | 9/2010 | Papavasiliou et al. | 336/200 |
| 2011/0227689 | A1 * | 9/2011 | Chang et al. | 336/200 |
| 2011/0304013 | A1 * | 12/2011 | Chen et al. | 257/531 |
| 2012/0056680 | A1 * | 3/2012 | Kim et al. | 330/307 |
| 2012/0068303 | A1 * | 3/2012 | Chu et al. | 257/531 |
| 2013/0106554 | A1 * | 5/2013 | Girard et al. | 336/200 |
| 2013/0164904 | A1 * | 6/2013 | Smith et al. | 438/381 |
| 2013/0234285 | A1 * | 9/2013 | Hijioka et al. | 257/531 |

OTHER PUBLICATIONS

Morrison, "Regulators Embed Inductors to Save Space and Ease Use" Power Electronics Technology Jul. 2007 www.powerelectronics.com, pp. 46-47.

DigiTimes, The Petrov Group, "Power management ICs in portable devices represent nearly 40% of total analog IC revenues"—Aug. 10, 2010, http://www.digitimes.com/print/a20100810VL203.html.

DigiTimes, The Petrov Group, "Thirty billion power conversion ICs enable power management applications", Aug. 24, 2010, http://www.digitimes.com/print/a20100824PR200.html.

Pan et al. "Fabrication and modeling of silicon-embedded high-Q inductors", J. Micromech. Microeng. 15 (2005) pp. 849-854.

Wang et al. "SU-8 enhanced high power density MEMS inductors", Industrial Electronics, 2008.

Wu et al. "A Novel Silicon-Embedded Coreless Inductor for High-Frequency Power Management Applications" IEEE Electron Device Letters, vol. 32, No. 1, Jan. 2011.

Pan, et al., "Fabrication and Modeling of Silicon-Embedded High-Q Inductors", Journal of Micromechanics and Microengineering, 2004, pp. 809-812, vol. 15, No. 4., IEEE.

* cited by examiner

MONOLITHIC MAGNETIC INDUCTION DEVICE

CLAIM OF PRIORITY TO RELATED APPLICATION

The subject application for patent claims the benefit of U.S. Provisional Patent Application Ser. No. 61/344,566, entitled "MONOLITHIC MAGNETIC INDUCTION DEVICE" and filed Aug. 23, 2010, assigned to the assignee hereof and hereby incorporated by reference herein in its entirety.

FIELD OF THE INVENTION

The subject disclosure relates generally to magnetic induction device structures employed in conjunction with integrated circuit electronics, and more specifically to monolithic magnetic inductors having thick conductor coils with high thickness to width ratio relative to many conventional inductors.

BACKGROUND

Magnetic induction devices, including inductors, transformers and related devices, are employed in a wide range of electronic and magnetic applications. Examples of such applications in common use include power management applications, such as switched mode power supplies and driver circuits, for portable consumer electronic devices. Other example applications include digital isolators employed in various integrated circuit devices, as well as radio frequency power amplifiers for wireless transmitters, used for instance in cellular telephones, WiFi communication devices, and so on.

In many applications, an inductor coil having a large ratio between its inductance and DC resistance can provide much better circuit performance and reliability than coils have lower inductance/DC resistance ratios. One way of increasing this ratio is by reducing DC resistance, which can be accomplished by employing inductor coil tracks having large cross-sectional area. However, particularly in integrated circuit applications, significant interest exists in maintaining and even decreasing size of electronic components. For instance, smaller integrated circuit components typically results in higher component density (e.g., more transistors, transformers, rectifiers, etc., per unit area), which leads to increased processing power, increased memory storage, or the like for a given size integrated circuit chip. Similar benefits can be achieved for miniaturizing integrated power modules, switched mode power supplies and driver circuit applications. Moreover, many applications such as mobile phones, digital cameras, and so forth, have size, weight and component density requirements that must be met by individual components or groups of components. In some applications, reduced size can also lead to reduced cost, higher component reliability, or a simplified and flexible design. Accordingly, though increasing cross-sectional area can provide reduced DC resistance, detrimental effects can occur as well since increased cross-sectional area usually results in increasing overall component size. Further, design or cost constraints may limit the cross-sectional area to a maximum.

One mechanism for achieving miniaturized and highly integrated power modules is the monolithic magnetic induction device. Monolithic integration of an inductor coil and silicon substrate has been used to enable a coil to be formed side-by-side with other circuit components, sometimes reducing substrate surface area consumption. Additionally, similar integrated circuit processes employed for transistors and other integrated circuit components can be utilized at least in part to form the monolithic inductor. This can reduce the inductor cost, facilitate simpler and more flexible mass production, as well as other benefits (e.g. reduced parasitics). As further surface area reduction is required beyond what these area consumption savings can provide, alternative or additional technologies may be required instead. One direction of modern research and development is to identify efficient ways of further reducing surface area consumption for inductor devices as well as integrated circuits alike.

SUMMARY

The following presents a simplified summary of the subject disclosure in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

Various aspects of the subject disclosure provide for a monolithic magnetic induction device having low DC resistance and low surface area compared with many conventional integrated circuit magnetic induction devices. According to a particular aspect, the induction device comprises a substrate (e.g., a semiconductor substrate) having coiled trenches formed in a bottom layer of the substrate, and holes formed in the substrate between the trenches and an upper layer of the substrate. Additionally, the magnetic induction device comprises one or more conductive coils embedded or formed within the trenches. For instance, a single conductive coil can be employed for a monolithic inductor, whereas a plurality of coupled conductive coils can be employed for a monolithic transformer (although the subject disclosure is not so limited). The magnetic induction device further comprises a set of conductive vias formed in the holes that electrically connect the bottom layer of the substrate with the upper layer.

According to further aspects of the subject disclosure, a monolithic magnetic induction device can further comprise an electrical insulation layer formed over the trenches or the holes. The insulation layer can be formed by chemical vapor deposition, sputtering, or other suitable deposition process. In a particular aspect, the insulation layer can be formed by creating a porous silicon region and oxidizing the porous silicon region. Oxidizing can be caused by thermal oxidation in at least one aspect of the subject disclosure.

According to still other aspects, the conductive coil(s) or conductive vias can be formed by deposition of a layer of conductive material on the walls of the holes and trenches within the substrate. For instance, the deposition can comprise filling the holes and trenches with the conductive material using an electroplating deposition process. Excess conductive material can be removed with a planarization process applied to a top outer surface of the substrate and a bottom outer surface of the substrate.

In one particular aspect of the subject disclosure, a monolithic magnetic induction device can be coreless. In an alternative aspect, a magnetic core can be formed near a center of the conductive coils.

In still other aspects, one or more integrated circuit components can be formed in the upper layer of the substrate, above the conductive coil(s). This can help to fully utilize the volume of the substrate, by stacking the one or more integrated circuit components at least in part above the conductive coil(s). Further, a subset of the integrated circuit components can be electrically connected to the inductor coil(s) by one or more of the conducting vias. In an alternative, or additional aspect, a further subset of the integrated circuit components can be isolated from the inductor coil(s) by not being connected to, or being isolated from the conducting vias.

In additional aspects, the magnetic induction device can be fabricated separately from additional integrated circuit components formed in the substrate. According to alternative aspects, fabrication of the magnetic induction device can at least in part be intermingled with fabrication of the additional integrated circuit components. For instance, the magnetic induction device and integrated circuit components can be formed at least in part by the same process modules.

In various aspects of the subject disclosure, a monolithic embedded magnetic induction device can have different dimensions or physical characteristics to meet particular electrical design characteristics, or size characteristics. For instance, the substrate can have a thickness of more than about 100 micrometers (μm), in some aspects. In other aspects, the trenches and coil can have a thickness of greater than about 50 μm. In one aspect, the coil or vias can be formed of copper metal, whereas in other aspects a different metal or different conductor (e.g., silver, . . . ) can be used. In another aspect, the substrate can have a surface area equal to or less than about 1 square millimeter (mm). Further, according to one or more aspects, the magnetic induction device can have an inductor efficiency of greater than about 90% and a current carrying capability of about 0.5 amps or greater.

The following description and the annexed drawings set forth in detail certain illustrative aspects of the disclosed subject matter. These aspects are indicative, however, of but a few of the various ways in which the principles of the innovation can be employed and the disclosed subject matter is intended to include all such aspects and their equivalents. Other advantages and novel features of the disclosed subject matter will become apparent from the following detailed description of the innovation when considered in conjunction with the drawings.

DETAILED DESCRIPTION

Figure 1:
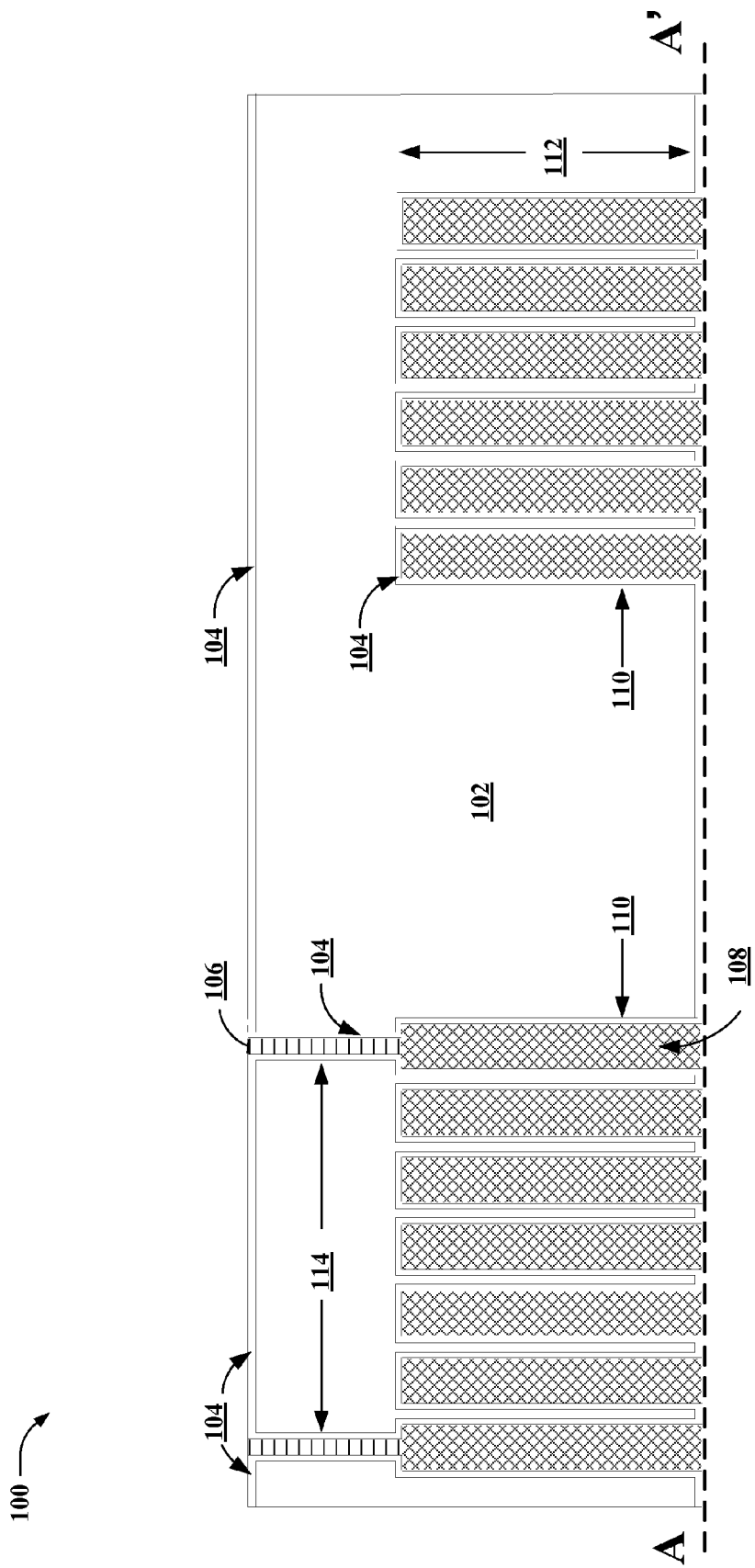
FIG. 1 depicts a cross-sectional view diagram of an example monolithic inductor according to aspects of the subject disclosure.

The disclosed subject matter is described with reference to the drawings, wherein like reference numerals are used to refer to like elements throughout the description. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram or schematic form in order to facilitate describing the subject innovation.

As utilized herein, the terms "component," "circuit," "architecture" and the like are intended to refer to a computer or electronic-related entity, either hardware, a combination of hardware and software, or software (e.g., in execution). For example, a component can be one or more transistors, a coil, a power coupler, a multi-phase coupled coil, a memory cell, an arrangement of transistors or memory cells, an application specific integrated circuit, a controller, a processor, a process running on the processor, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, a system or architecture can include an arrangement of electronic hardware (e.g., parallel or serial transistors), processing or fabrication instructions and a processor, which implement the processing instructions in a manner suitable to the arrangement of electronic hardware. In addition, an architecture can include a single component (e.g., a coil, a via, a transistor, a gate array, . . . ) or an arrangement of components (e.g., coupled coils, a set of vias, a series or parallel arrangement of transistors, power leads, electrical ground, input signal lines and output signal lines, and so on). A system can include one or more components as well as one or more architectures. One example system can include a silicon chip having multiple integrated circuit components, arranged electrically so as to produce a combined functional output in response to an input. It is to be appreciated that some overlap in definitions is anticipated, and an architecture or a system can be a stand-alone component, or a component of another architecture, system, etc.

In addition to the foregoing, the claimed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, a signal propagating in a medium, or the like. Of course, those skilled in the art will recognize many modifications can be made to this configuration without departing from the scope or spirit of the claimed subject matter.

To achieve miniaturized and highly integrated power modules, the monolithic integration of magnetic induction devices utilized in these power modules has been a target of recent development efforts. However, due to size and substrate area restraints, the available width and spacing for the induction coil tracks are limited. Therefore various aspects of the subject disclosure provide thick induction coils for obtaining a large cross-sectional area of the induction coil tracks, for a given coil radius and track width. This large cross-sectional area provides a mechanism to reduce DC resistance.

A large portion of existing monolithic magnetic induction devices are fabricated on top of a substrate, and not embedded within the substrate. However it is difficult to fabricate high aspect ratio thick conductive tracks above the substrate, and the space available above the substrate is usually limited by the space provided in the application or the type of packaging technology. Therefore it is difficult for these on-substrate magnetic induction devices to obtain magnetic induction coils thicker than 100 μm. In addition, these on-substrate magnetic induction devices add extra thickness to the overall device package, reducing component density for the device package.

Other monolithic magnetic induction devices are partly or fully embedded in the substrate. The thickness of the substrate is utilized to accommodate the magnetic induction coils; therefore thicker magnetic induction coils are achieved with the embedded devices. However, many substrate-embedded magnetic induction devices do not fully utilize the thickness of the substrate, often due to various technology limitations. Examples of this can be found in (1) U.S. Pat. No. 6,927,662 entitled "Integrated Transformer Configuration" having issued August 2005, (2) U.S. Pat. No. 7,404,249 entitled "Method of Manufacturing an Inductance" having issued July 2008, (3) U.S. Pat. No. 5,519,582 entitled "Magnetic Induction Coil for Semiconductor Devices" having issued May 1996, and (4) U.S. Pat. No. 6,830,970 entitled "Inductance and Via Formation in a Monolithic Circuit" having issued December, 2004. The thickness of the substrate-embedded magnetic induction coils in these technologies is less than 50 μm.

Other substrate-embedded magnetic induction devices with magnetic induction coils thicker than 100 μm do exist. For example (5) US Patent Application Publication No. 2010/0020509 entitled "Integrated Power Passives" filed January, 2010, and (6) S. Prabhakaran, Y. Sun, P. Dhagat, W. Li and C. R. Sullivan, "Microfabricated V-Groove Power Inductors for High-Current Low-Voltage Fast-Transient DC-DC Converters", Proceedings of Power Electronics Specialists Conference, Recife, Brazil, pp. 1513-1519, June 2005. However, the substrates of these devices are etched through both sides of the substrate to form the magnetic induction coils, making their structures prone to mechanical failure (5). This also consumes the surface areas of both sides of the substrate, limiting the active devices of the monolithic circuit to side-by-side fabrication, reducing density of the overall monolithic circuit. On the other hand, when using wet etching to form grooves in a substrate, much of the substrate volume is wasted due to the V-shape of the grooves. This limits the height of an embedded magnetic induction coil formed in the grooves, again reducing compactness, or reducing cross-sectional area of the coil (and increasing DC resistance) (6).

Although embedding of the magnetic induction coils in the substrate saves space and allows thick magnetic induction coils, a compact monolithic circuit can still be difficult to achieve due to the consumption of substrate surface area which is needed for the fabrication of both the active and passive devices of the monolithic circuit. To fully utilize the substrate surface area, (3) and (4) disclose embedding of the magnetic induction coils in the substrate at the bottom side and interconnecting them to the top side where the active devices of the monolithic circuit can be fabricated. However, they did not fully utilize the thickness of the substrate, and the thickness of the magnetic induction coils is less than 50 μm. Furthermore, the process of interconnecting the bottom side magnetic induction coils to the top side is complicated. In order to interconnect the magnetic induction coils on the bottom side of the substrate to the active devices on the top side of the substrate, an extra substrate is used by (3). The bottom-side magnetic induction coils are flip chip bonded to the said extra substrate, while the front-side active devices are also wire bonded to the said extra substrate. Thus, the structure disclosed by (3) is not indeed monolithic. In contrast, through holes are formed in the substrate by laser in order to form vias to interconnect the magnetic induction coil to the other side of the substrate in (4). This laser etching process has to be performed hole by hole, therefore is not suitable for mass production. Moreover, thermal oxidation is used by (4) to form the insulation layer between the magnetic induction device and the substrate. This introduces large thermal budget, and is not compatible with the fabrication of the active devices of the monolithic circuit.

Various aspects of the subject disclosure provide monolithic magnetic induction devices with very thick magnetic induction coils embedded in the substrate at one side and interconnected to the other side of the substrate efficiently where other circuit components can be fabricated. The magnetic induction device is comprised of a substrate, having one or more thick (e.g., >50 μm) induction coils embedded in a bottom layer of the substrate. Holes having relatively small cross-sectional area are formed in the substrate, between the induction coils and an upper layer of the substrate in which one or more other integrated circuit components can be fabricated. Moreover, an insulating layer can be formed between the substrate and the magnetic induction coils and conductive vias. The upper layer can accommodate active devices for the monolithic circuit, and provide mechanical support in lieu of the material etched away to form trenches that host the magnetic induction coil.

According to further disclosed aspects, fabrication of a monolithic magnetic semiconductor device can comprise forming deep trenches in a substrate upward from a bottom surface of the substrate. The trenches can be formed according to a contour of a magnetic induction coil to be embedded in the trenches. Further, holes can be formed in the substrate from the top surface of the substrate, connecting the trenches to the top surface. Additionally, an insulation layer can be formed covering the trenches and the holes, and the trenches and holes can then be filled with conductive material (e.g., copper, copper alloy or copper derivative, silver, other suitable conductors, . . . ).

Because almost the full thickness of a semiconductor substrate is utilized, a conductive coil can have much thicker coils than conventional devices, increasing cross-sectional area of the coils (also known in the art as vertical area), and decreasing DC resistance. Moreover, by fully utilizing the volume of the substrate, a more compact monolithic integrated circuit can be provided. Moreover, fabrication of magnetic induction coil and other circuit components on different sides of a substrate provides for increased component density for a given silicon chip.

Referring now to the drawings, FIG. 1 illustrates a cross-sectional view of a monolithic inductor 100 according to various aspects of the subject disclosure. As depicted, the cross-sectional view is depicted from the reference of an AA' dotted line, shown in a top down view at FIG. 2, infra. Monolithic inductor 100 can comprise a substrate 102, which can comprise a semiconductor substrate. In at least one aspect, substrate 102 can be a suitable silicon semiconductor substrate.

Substrate 102 can comprise a series of trenches 110 formed into a bottom layer or lower region of substrate 102. Trenches 110 can have a thickness 112 (or height) sized to allow for a relatively thick magnetic induction coil. Thickness 112 can be about 50 μm or greater in one aspect of the subject disclosure. In another aspect, thickness 112 can be about 100 μm or greater. In yet another aspect, thickness 112 can be about 200 μm or greater. Generally, thickness 112 can be from about 50 μm to as large as several μm smaller than a thickness of substrate 102. Track width of trenches 110 can be as small as one tenth of the thickness of the magnetic induction coil, and track width between adjacent tracks can be as small as one fifteenth of the thickness of the magnetic induction coil.

In addition to the foregoing, substrate 102 can comprise one or more holes 114 formed into a top layer or upper region of substrate 102. Holes 114 can be formed to connect at least a subset of trenches 110 with the upper region of substrate 102. In at least one aspect, holes 114 are formed through the top of substrate 102, opening out of its top surface.

According to particular aspects of the subject disclosure, monolithic inductor 100 can comprise an insulating layer 104 that covers the trenches 110 and holes 114. As can be seen, insulating layer 104 can in effect coat, or cover the inner surface of substrate 102 at trenches 110 and holes 114. Insulating layer 104 can therefore provide some electrical resistance between substrate 102 and components formed within the trenches and holes.

Further to the above, monolithic inductor 100 can comprise formation of conductive coils 108 within trenches 110. Conductive coils 108 can be formed by depositing a conductive material within trenches 110. The conductive material can include copper in at least one aspect, although the subject disclosure is not limited to copper conductive coils 108, and various suitable conductive materials are considered within the scope of the subject disclosure. Additionally, monolithic inductor 100 can comprise formation of vias 106 within holes 114. Vias 106 can be formed by depositing a conductive material within holes 114, which can be the same or a different conductive material as used for conductive coils 108.

The height of the conductive vias 106 equals the thickness of the remaining top layer of the substrate which does not accommodate trenches 110 and the magnetic induction coil, which in turn equals to the thickness of the substrate 102 excluding the thickness 112 of trenches 110 and the magnetic induction coil, and has a minimum value of about 10 μm. A width of the conductive vias 106 typically can be as small as one tenth of the depth of the vias 106.

It should be appreciated that various dimensions for trenches 110, thickness 112, and other dimensions of monolithic inductor 100 can be employed to meet various electrical, area, or volume design constraints. According to a particular aspect, conductive coils 108 can have a DC resistance of about 100 milliohms or less, and a quality factor of about 3.9 at 100 megahertz operating frequency. Further, monolithic inductor 100 can have an inductor efficiency of about 90% or better in some aspects, and can have an inductor efficiency of about 93.4% of better in other aspects. In still other aspects, monolithic inductor 100 can have a current carrying capability of about 0.5 amps or better, whereas in other aspects the current carrying capability can be about 0.6 amps or better.

According to further aspects, substrate 102 can have a thickness from about 100 μm to about 1 millimeter, or more. In a particular aspect, substrate 102 can be about 300 μm. In an additional aspect, substrate 102 can have a surface area (viewed from the top or bottom of substrate 102) of about 1 square millimeter or less. In another aspect, the surface area can be about 0.8 square millimeters or less, whereas in yet another aspect the surface area can be about 0.5 square millimeters or less. In one aspect, a magnetic core can be embedded in substrate 102. In an alternative aspect, substrate 102 and monolithic inductor 100 can be coreless.

According to one particular embodiment, monolithic inductor 100 can have a radius of about 450 μm, 7 turns of conducting coils 108, coil thickness 112 of about 200 μm, a track width of individual conducting coils 108 of about 30 μm, a spacing between individual conducting coil 108 of about 15 μm, and a width of vias 106 of about 10 μm.

In an alternate embodiment, monolithic inductor 100 can have a radius of about 330 μm and 2 turns of conducting coils 108. Additionally, monolithic inductor 100 can comprise a coil thickness 112 of about 100 μm, a track width of conducting coils 108 of about 15 μm, a track spacing between conducting coils 108 of about 10 μm, and a width of vias 106 of about 30 μm.

In yet another alternative embodiment, monolithic inductor 100 can have a radius of about 700 μm and 5 turns of conducting coils 108. Additionally, monolithic inductor 100 can comprise a coil thickness 112 of about 100 μm, a track width of conducting coils 108 of about 15 μm, a track spacing between conducting coils 108 of about 10 μm, and a width of vias 106 of about 30 μm.

Figure 2:
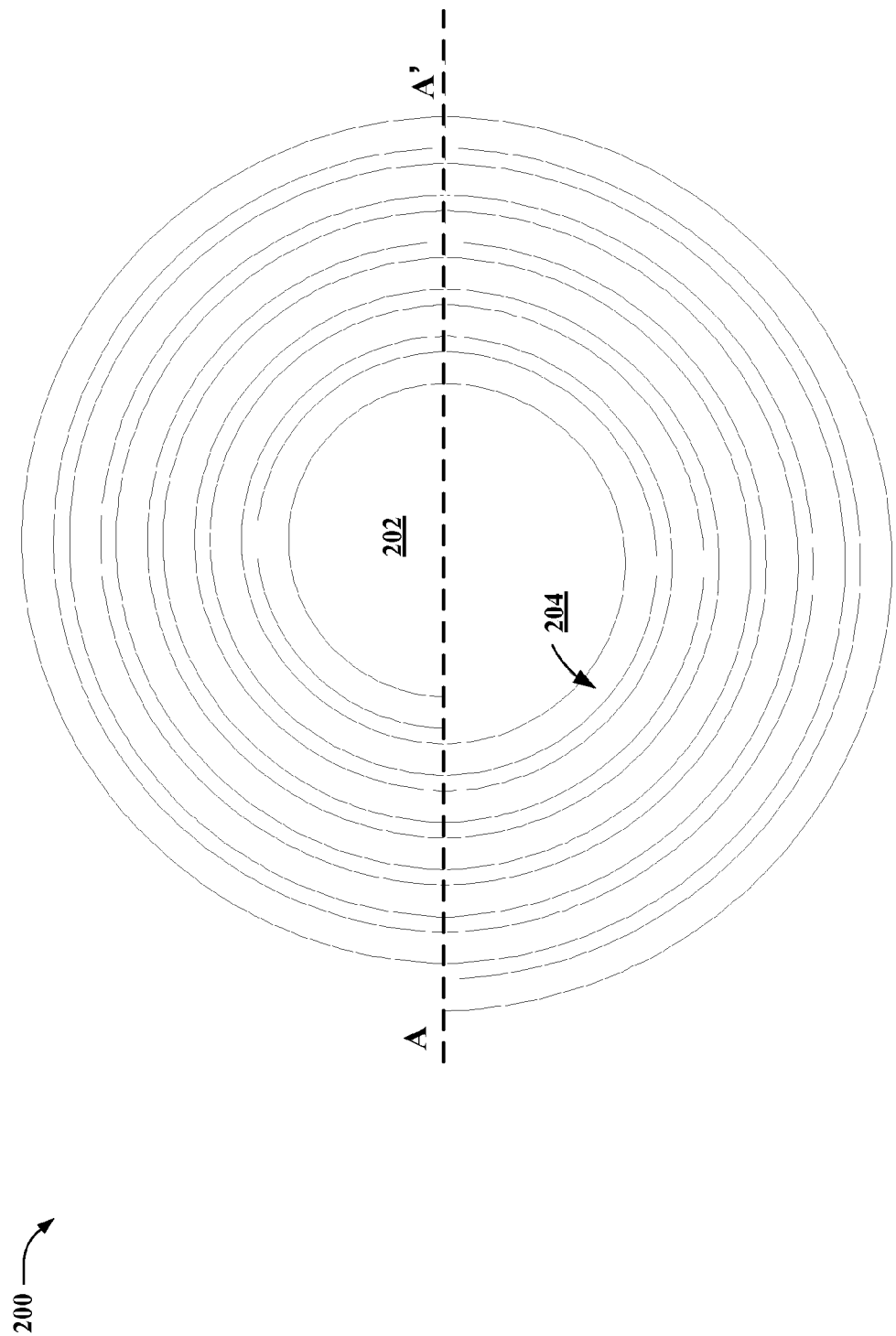
FIG. 2 illustrates a bottom view diagram along the indicated line of an example conductive coil for the monolithic inductor of FIG. 1.

FIG. 2 illustrates a top view of the magnetic conducting coil 200 of monolithic inductor 100, of FIG. 1. The cross-sectional view of monolithic inductor 100 of FIG. 1 is along the AA' axis depicted at FIG. 2. As is depicted, conducting coil 200 comprises a central region 202 that can be coreless, or can comprise a magnetic core. Additionally, a continuous conducting metal trench 204 has one end near the central region 202 of conducting coil 200, and a second end at an outer edge of conducting coil 200 (near reference A of the AA' line).

Figure 3:
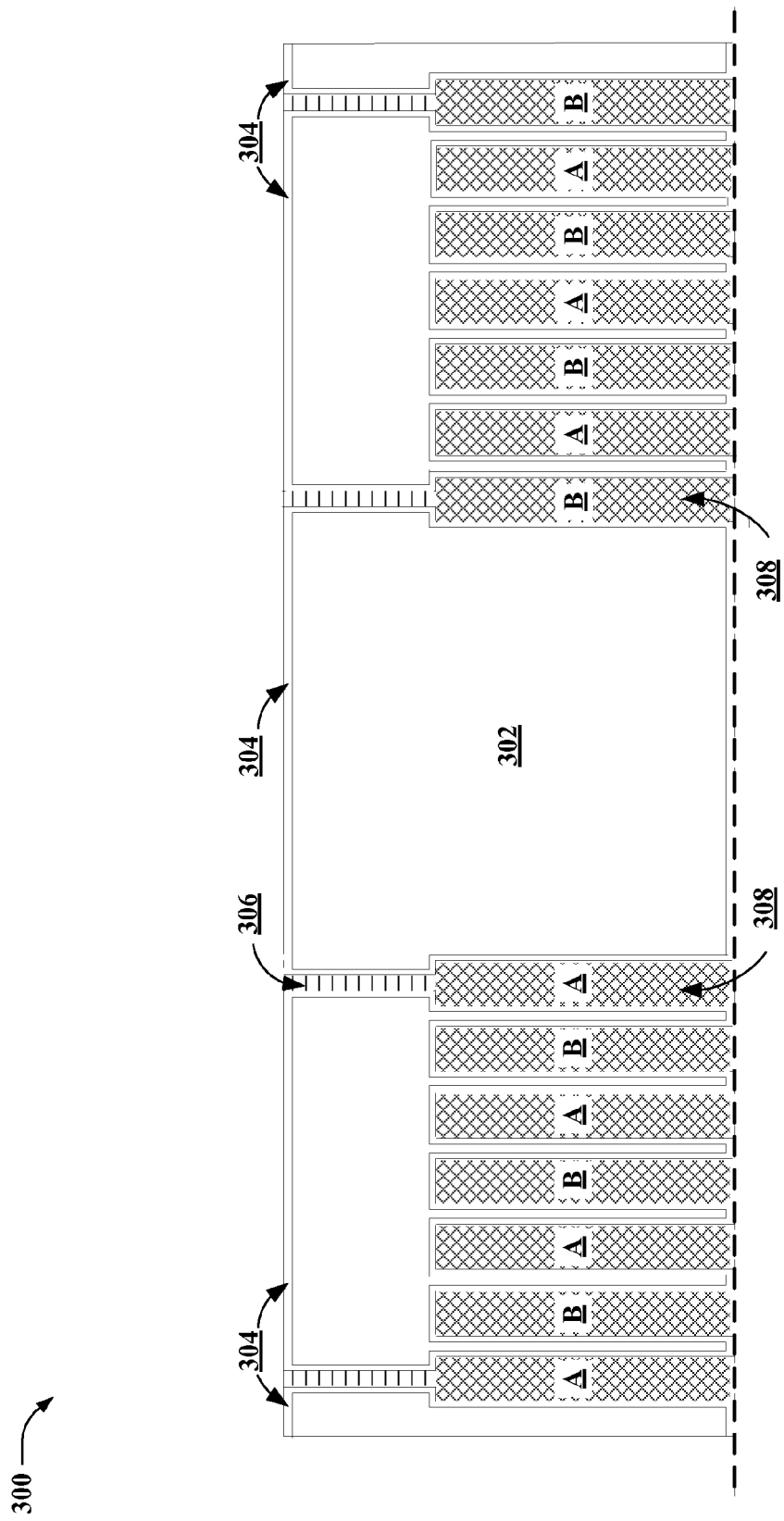
FIG. 3 depicts a cross-sectional view diagram of a monolithic power transformer or monolithic two-phase coupled inductor according to a further aspect.
Figure 4:
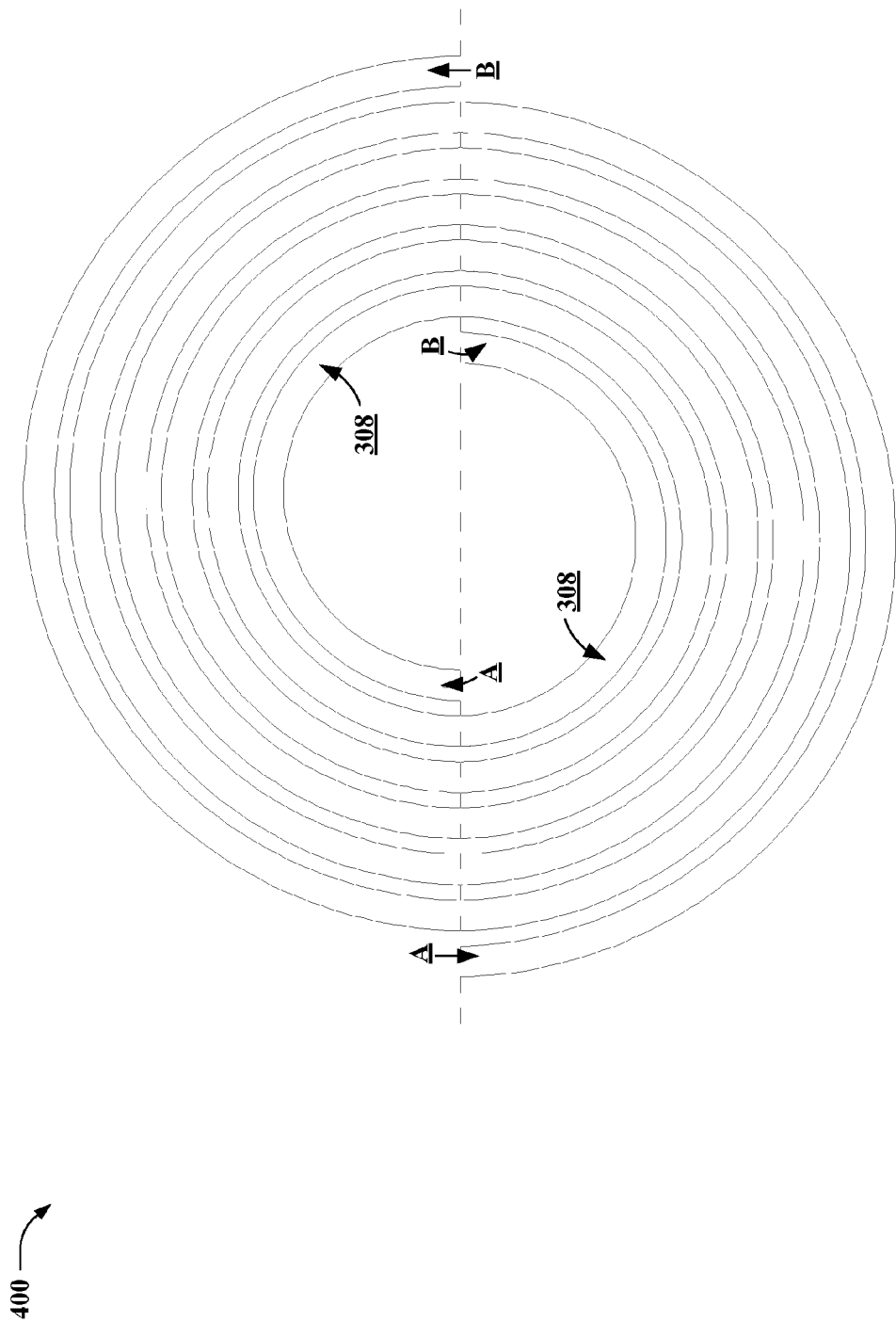
FIG. 4 illustrates a bottom view diagram of the coupled inductor coil for the power transformer/two-phase coupled inductor of FIG. 3.
Figure 5:
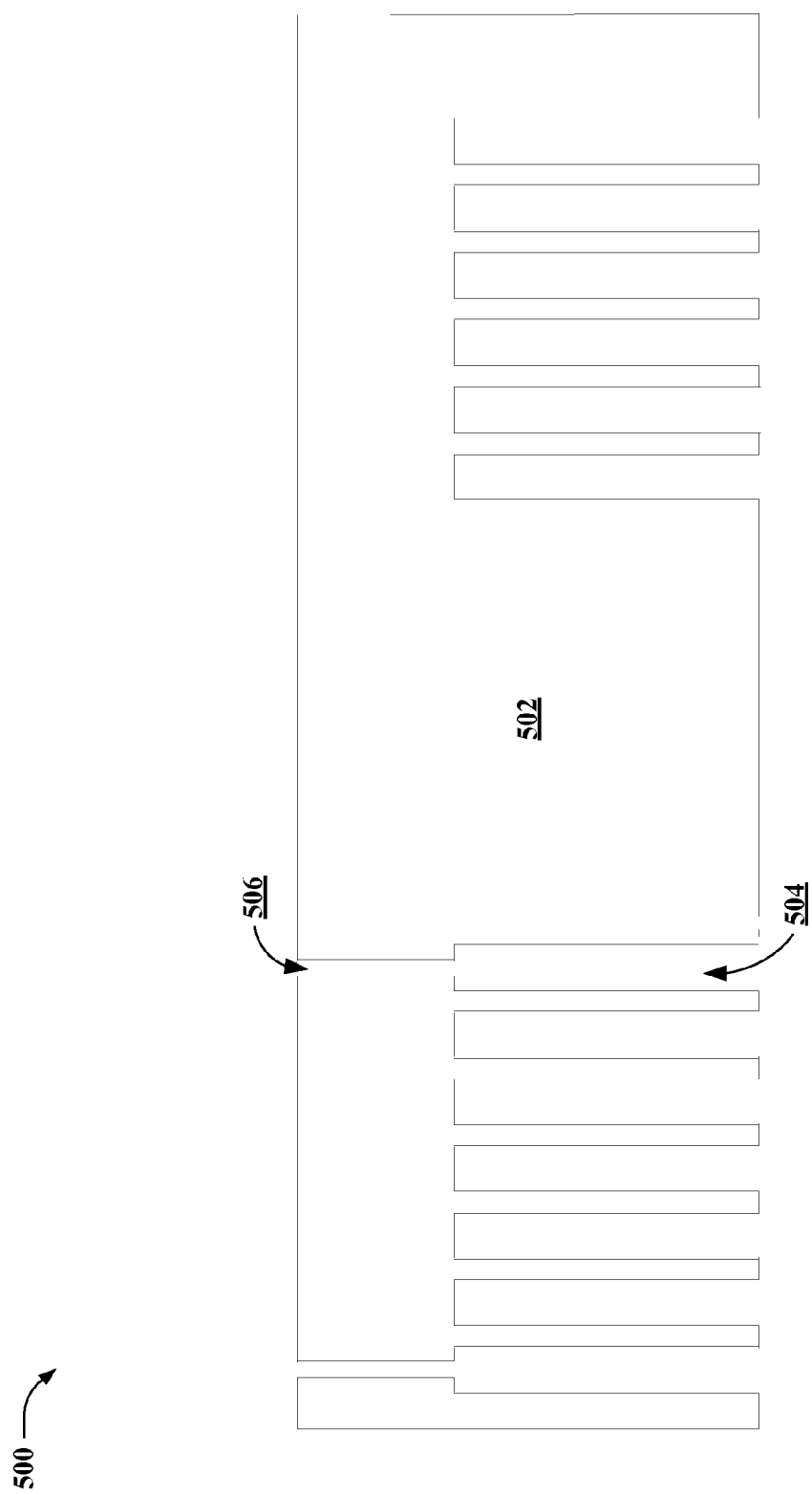
FIG. 5 depicts a cross-sectional view diagram of an example semiconductor substrate and etching/trenching process according to particular aspects.
Figure 6:
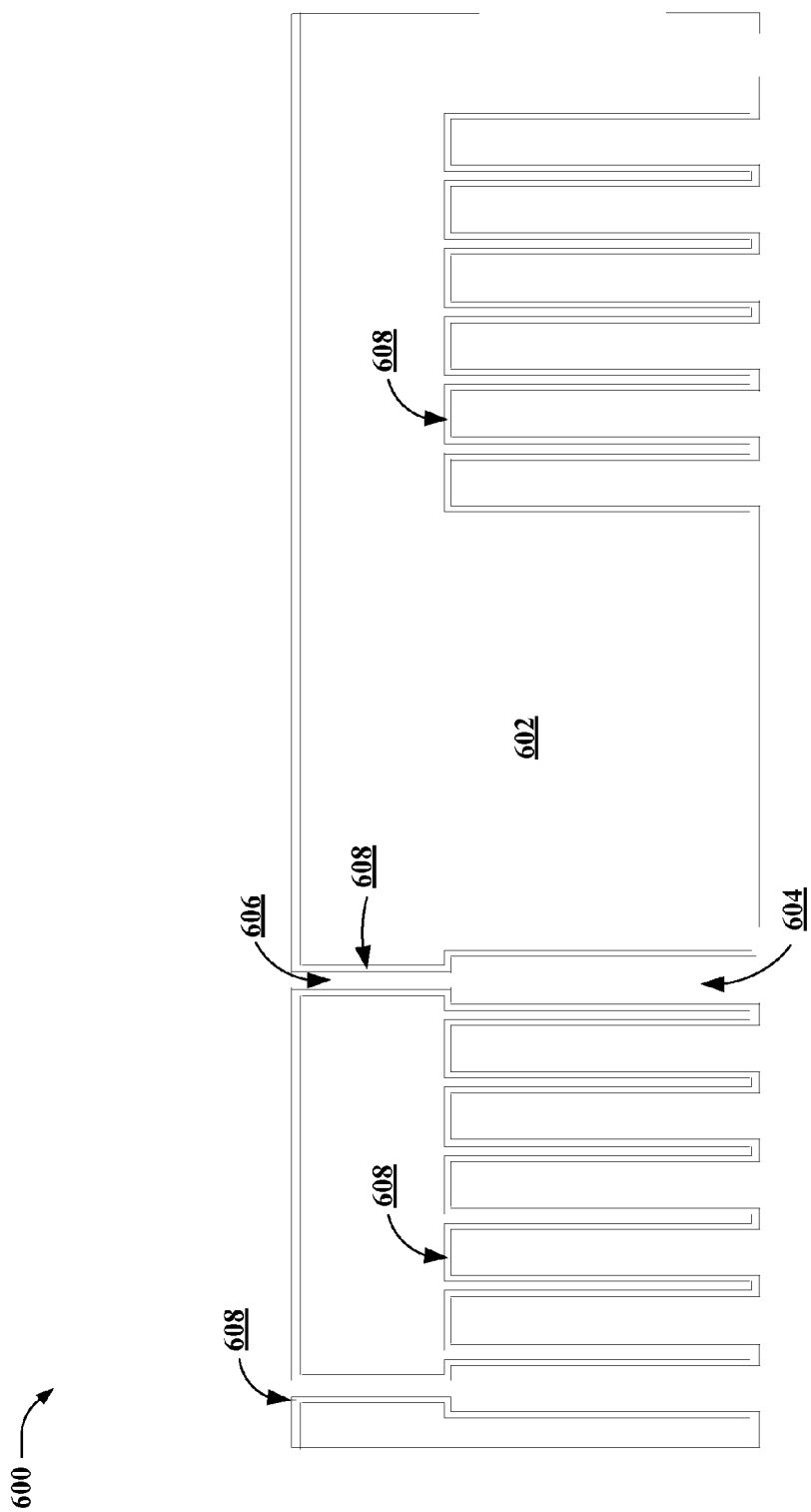
FIG. 6 illustrates a cross-sectional view diagram of an example insulating process for holes and trenches formed in the substrate of FIG. 5.
Figure 7:
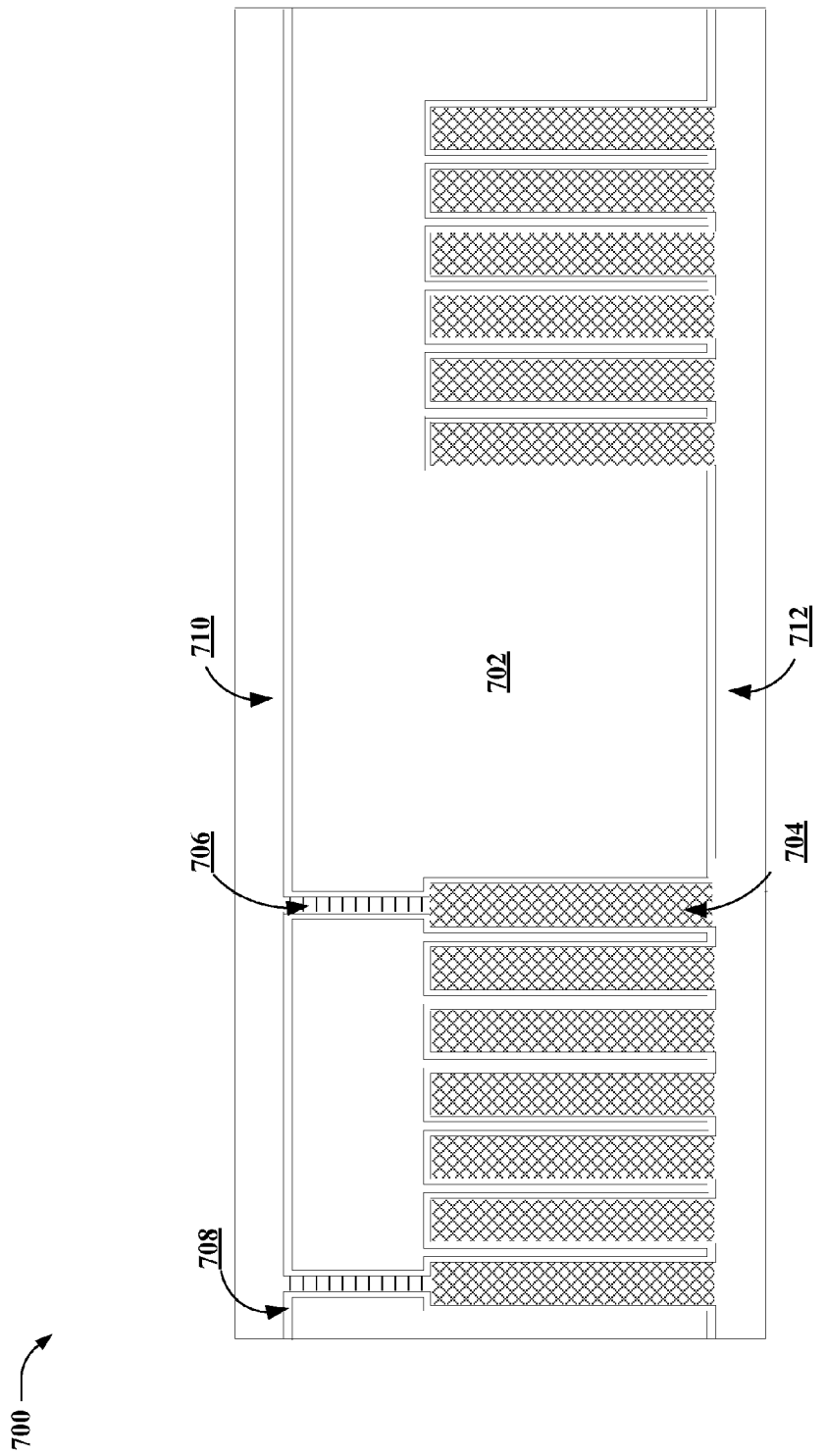
FIG. 7 depicts a cross-sectional view diagram of a sample metal forming process for forming conductive coils and vias for the substrate of FIG. 5.
Figure 8:
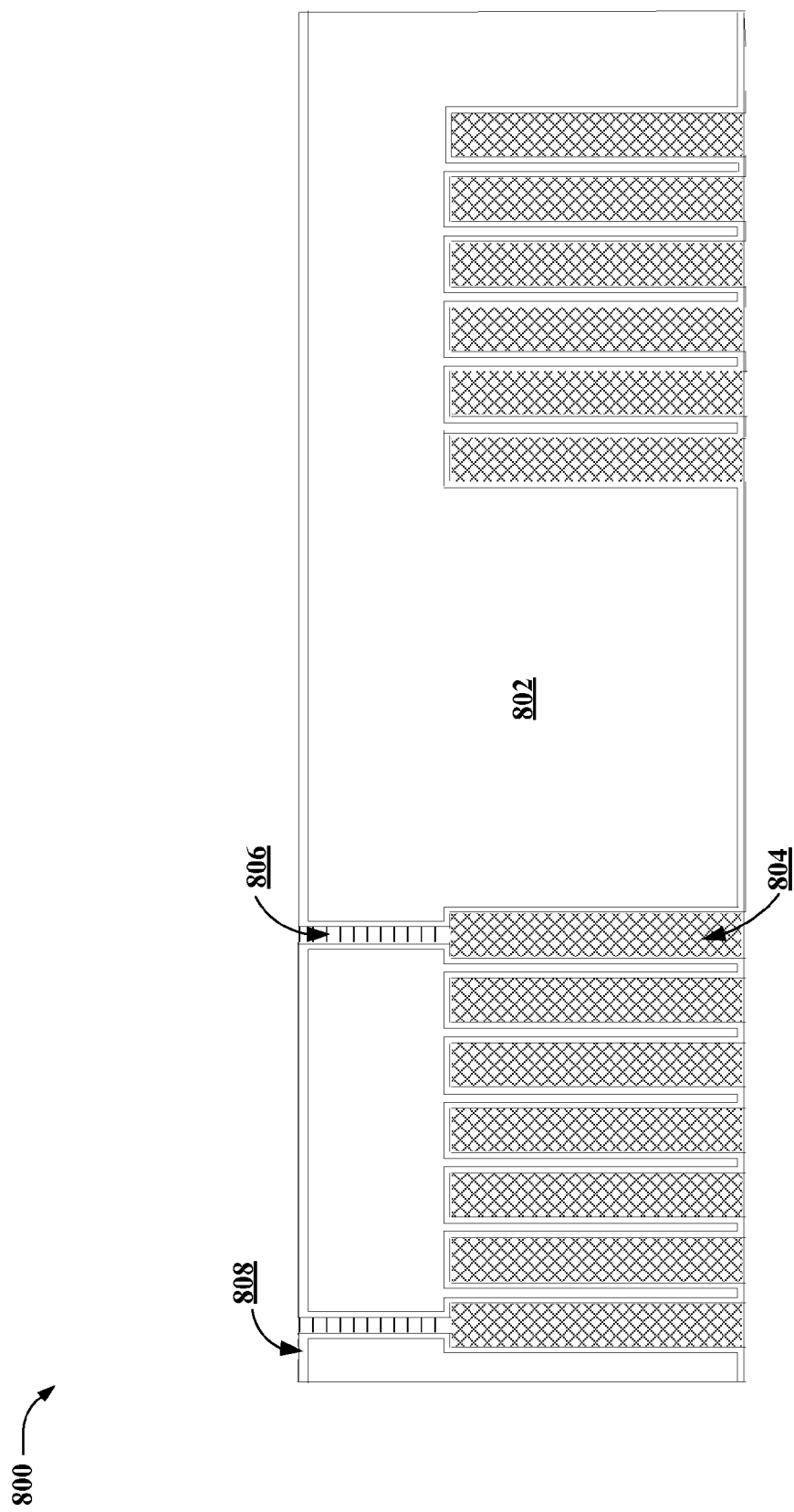
FIG. 8 illustrates a cross-sectional view diagram of an example process for removing excess conductive material as a result of metal forming of FIG. 7.

FIGS. 3 and 4 show the cross-sectional view 300 and bottom view 400, respectively, of a monolithic transformer (or the monolithic two-phase coupled inductors) along AA' according to one embodiment of the present invention. The monolithic transformer/coupled inductors of FIGS. 3 and 4 can be substantially similar to the monolithic inductor shown in FIG. 1 and FIG. 2, supra, except that two magnetic induction coils 308, coil A and coil B, are embedded in the substrate with corresponding conductive vias 306. According to the present embodiment, magnetic induction coils 308 (coil A and coil B) have circular spiral shapes. However, according to the present invention it could be any planar shape such as rectangular spiral shape, racecourse shape, a straight line shape, or other suitable planar shape, based on the design of the monolithic transformer or the monolithic two phase coupled inductors. According to the embodiment depicted by FIGS. 3 and 4, the monolithic transformer or the monolithic two-phase coupled inductors comprises two coupled magnetic induction coils 308. However, according to other disclosed aspects, there can be other suitable numbers of coupled magnetic induction coils with corresponding conductive vias as needed and with any suitable kind of circuit connections.

According to further aspects, one monolithic transformer or one set of monolithic two-phase coupled inductors is embedded in the substrate 302. However, according to other aspects, there can be any suitable number of monolithic inductors, monolithic transformers, monolithic multi-phase coupled inductors embedded within substrate 302 and with any kind of circuit connections. According to the present embodiment, the magnetic induction coils 308 of the monolithic transformers or the coupled inductors are interleaved with each other. However, according to still other aspects, the magnetic induction coils of the monolithic transformers and the monolithic multi-phase coupled inductors can take any suitable position relative to each other.

In particular aspects, monolithic transformer/coupled inductors of FIGS. 3 and 4 can have primary DC resistance of about 0.44 ohms and secondary DC resistance of about 0.45 ohms. Alternatively, or in addition, the transformer/coupled inductors can have an inductance greater than about 30 nanohenries (nH), or a voltage gain greater than about −0.8 decibels (dB) between about 12 megahertz (MHz) and about 100 MHz, or a combination of the foregoing.

FIGS. 5 through 8 illustrate cross-sectional views 500, 600, 700, 800 of different stages of an example fabrication of a monolithic inductor according to additional aspects of the subject disclosure. Although a monolithic inductor is sketched for demonstration of the fabrication process, the same or similar fabrication process can be applied to fabricate multiple monolithic inductors, monolithic transformers, and monolithic multi-phase coupled inductors, or similar components.

Cross-sectional view 500 shows a semiconductor substrate 502, for example, made of silicon, in which holes 506 are formed on one side of the substrate (e.g., a top side) and very deep high aspect ratio trenches 504 are formed on an opposite side of the substrate (e.g., a bottom side). Either the holes 506 or the trenches 504 are formed first. The trenches 504 are formed according to the contour of the magnetic induction coils. The holes 506 and the trenches 504 are aligned such that the holes 506 are connected to the trenches 504 where vias can be formed therein (e.g., see FIG. 7, infra) to interconnect the coils to the top side of the substrate. Holes 506 and trenches 504 are obtained by anisotropic etching, for example, by plasma etching, of the substrate 502 from the two sides of the substrate 502 with masks which expose regions of substrate 502 comprising the holes 506 and trenches 504. According to a preferred implementation of the present invention, deep-reactive-ion-etching is used for fast formation of the holes 506 and trenches 504, and the alignment of holes 506 to trenches 504 is achieved using a double-sided contact aligner, and the alignment is as accurate as 1 µm.

Note that the substrate 502 of cross-sectional view 500 does not include shaded regions within trenches 504 or holes 506 as depicted, for instance, at FIGS. 1 and 3, supra. The shaded regions of FIGS. 1 and 3 represent conductive material (e.g., copper, silver, etc.) formed within the trenches and holes of a substrate. Note that the same or different conductive materials can be used for the trenches 504 or holes 506. FIGS. 1 and 3 utilize different cross-hatching patterns to indicate that different types of conductors can be utilized for the holes and trenches of those devices, however, it should also be appreciated that the same conductive material can be utilized for the holes and trenches of those devices, similar to trenches 504 and holes 506 (e.g., see FIG. 7, infra).

Cross-sectional view 600 shows the formation of a dielectric layer 608, for example, a silicon dioxide layer, at the surface of the holes 606 and trenches 604 for insulation. According to a preferred implementation of the present disclosure, the dielectric layer 608 is formed by chemical vapor deposition or sputtering which has a low thermal budget and allows the magnetic induction device to be fabricated after the fabrication of the active devices of the monolithic circuit. According to another embodiment of the present disclosure, the insulation layer is formed by thermal oxidation. According to yet another embodiment of the present disclosure, the insulation layer is formed by forming a thick porous silicon region at the surface of the trenches and holes, and oxidizing the said porous silicon region. The thick insulation layer (e.g., about 50 µm or less) can be formed using this approach to reduce the parasitic capacitance in the magnetic induction device, and to provide high voltage isolation between the magnetic induction device and the active devices, and also between the different magnetic induction coils of the magnetic induction device.

Cross-sectional view 700 shows the filling of holes (e.g., holes 606) and trenches (e.g., trenches 604) formed within substrate 702 with a conductive material, for example, copper, by electroplating. A metal layer is first sputtered on the walls of the holes and trenches and a complete filling of the holes and trenches are obtained by electrochemical deposition. Conductive vias 706 (horizontal hatching), magnetic induction coils 704 (cross-hatching) and excessive conductive layers 710 and 712 are formed, where the conductive vias 706 and magnetic induction coils 704 have very similar dimensions (thickness, width, and spacing) as the holes and trenches, respectively, due to the relative thin insulating layer 708.

Cross-sectional view 800 shows the monolithic inductor having the excessive conductive layers 710 and 712 removed. This can be accomplished by planarization of the top side and bottom side of substrate 802. According to one particular aspect, chemical mechanical polishing process can be used for the planarization. As depicted. Once excessive conductive layers 710 and 712 are removed, conductive coils 804 are connected by vias 806, which are all insulated from substrate 802 by insulating layer 808. Additionally, one or more other integrated circuit components (not depicted) can be formed in an upper layer of substrate 802 at least in part above conductive coils 804. It should be appreciated that forming the integrated circuit components can be performed prior to, after, or at least in part contemporaneous with formation of conductive coils 804, vias 806 or insulating layer 808.

Figure 9:
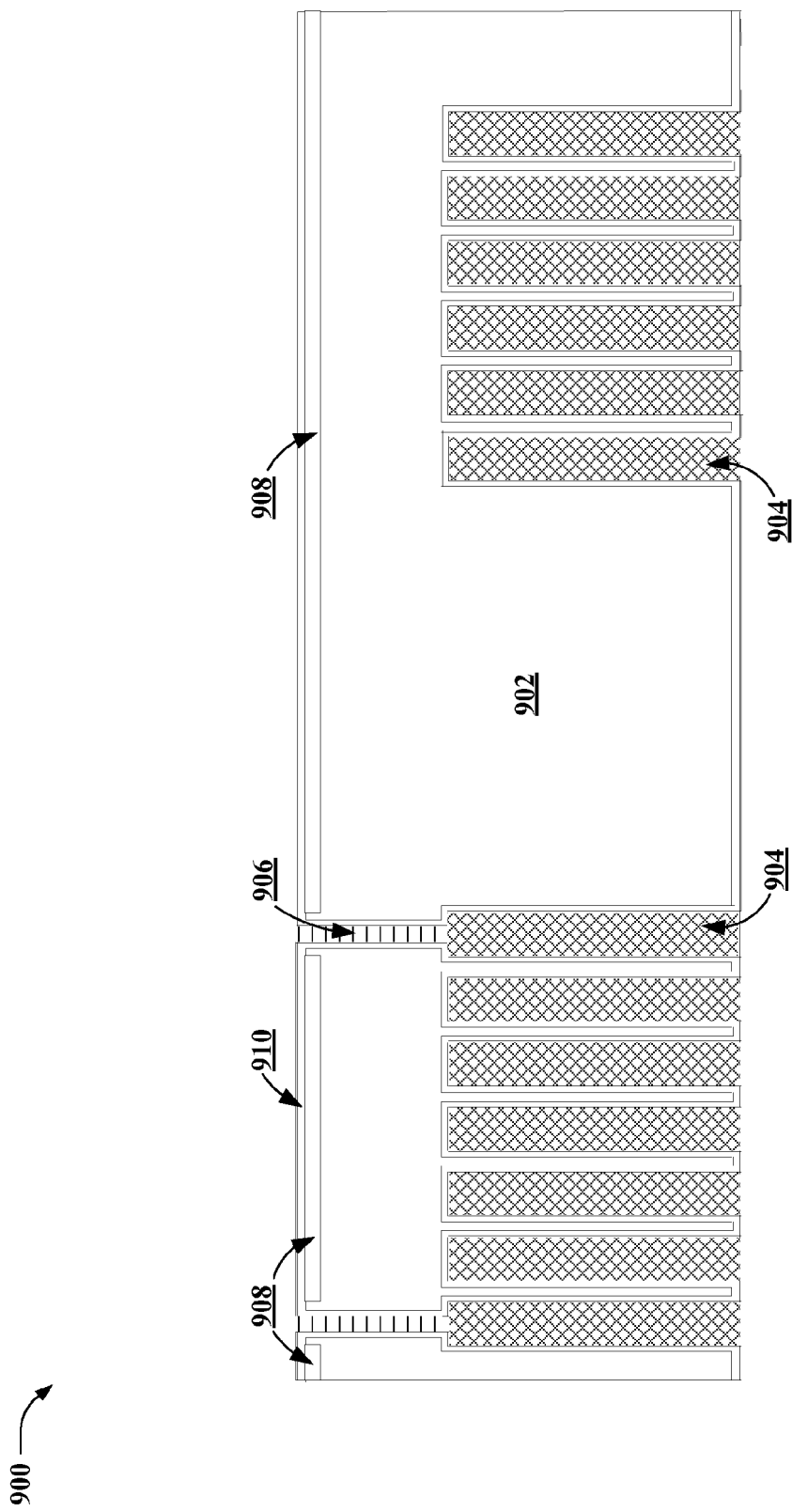
FIG. 9 depicts a cross-sectional view diagram of a monolithic inductor and additional integrated circuit components formed into a silicon substrate.

FIG. 9 illustrates a diagram of a cross-sectional view of a monolithic circuit 900 (circuit 900) comprising one or more inductor coils 904 and one or more additional circuit components 908 (e.g., integrated circuit components, active devices, and so on), according to still other aspects of the subject disclosure. In some aspects, inductor coil(s) 904 can comprise a relatively thick magnetic induction coil(s) as compared with many conventional embedded inductors. Further, circuit 900 can comprise a set of vias 906 electrically connecting the inductor coil(s) 904 to an upper portion of substrate 902. In addition, circuit 900 can comprise one or more other integrated circuit components 908, such as active devices, fabricated in the upper portion of substrate 902, utilizing substrate 902 efficiently. An insulating layer 910 can be formed over trenches in which inductor coil(s) 904 is formed, holes in which vias 906 are formed, or over integrated circuit components 908.

Although a single inductor coil is illustrated for FIG. 9, a similar configuration can be applied to multiple monolithic magnetic components in the circuit 900, which means that the inductor coil(s) 904 of the monolithic magnetic components can be fabricated at the opposite side of substrate 902 relative to integrated circuit components 908. In other aspects, inductor coil(s) 904, insulating layer 910 or vias 906 can be fabricated after or before the fabrication of integrated circuit components 908. The fabrication process of inductor coil(s) 904, vias 906 or insulating layer 910 can also at least in part be intermingled with the fabrication process of other circuit components 908, sharing some of the process modules. Conductive vias 906 and conventional interconnects which are not shown are used to interconnect the inductor coil(s) 904 with integrated circuit components 908. Although circuit 900 is illustrated as being coreless (without magnetic material), in some disclosed aspects circuit 900 can also have one or more magnetic core materials (e.g. Ni—Fe, Co—Ta—Zr, Co—Zr—O, Zn—Fe—O, Fe—Si—B—Cr).

Figure 10:
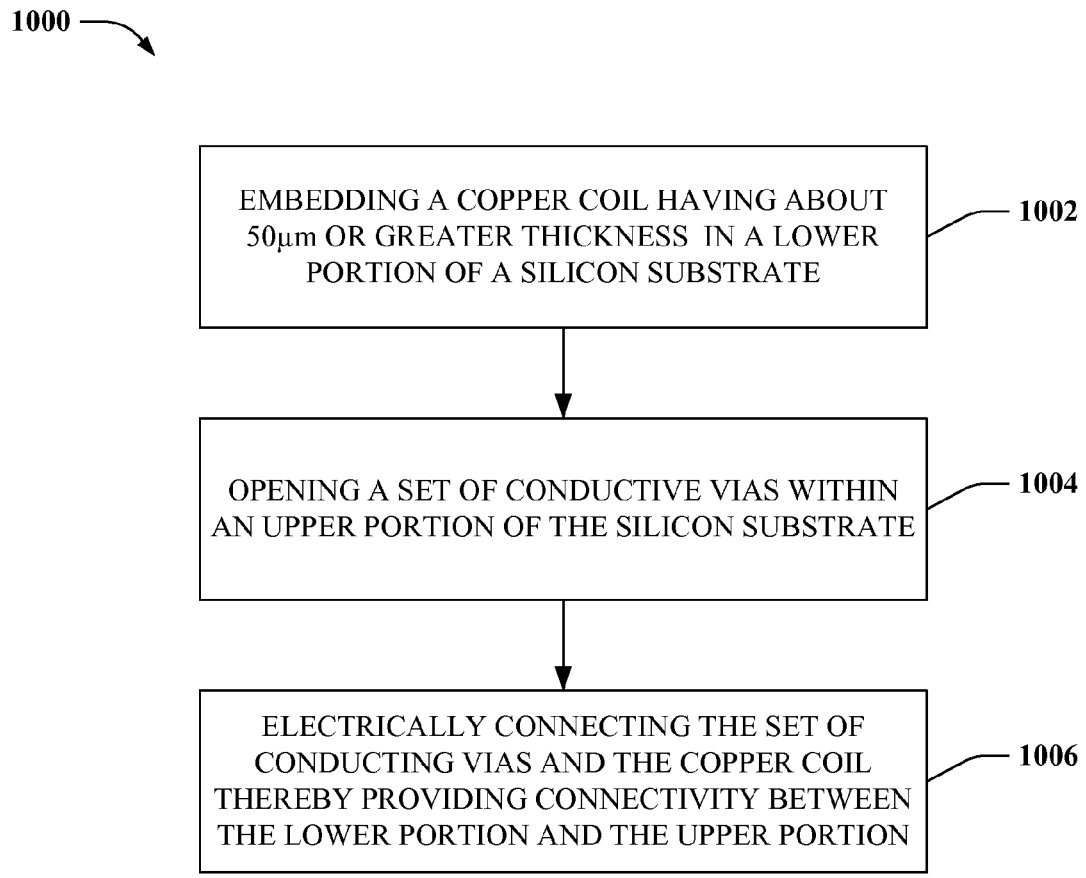
FIG. 10 depicts a flowchart of an example method for fabricating a monolithic embedded coreless magnetic inductor according to disclosed aspects.
Figure 11:
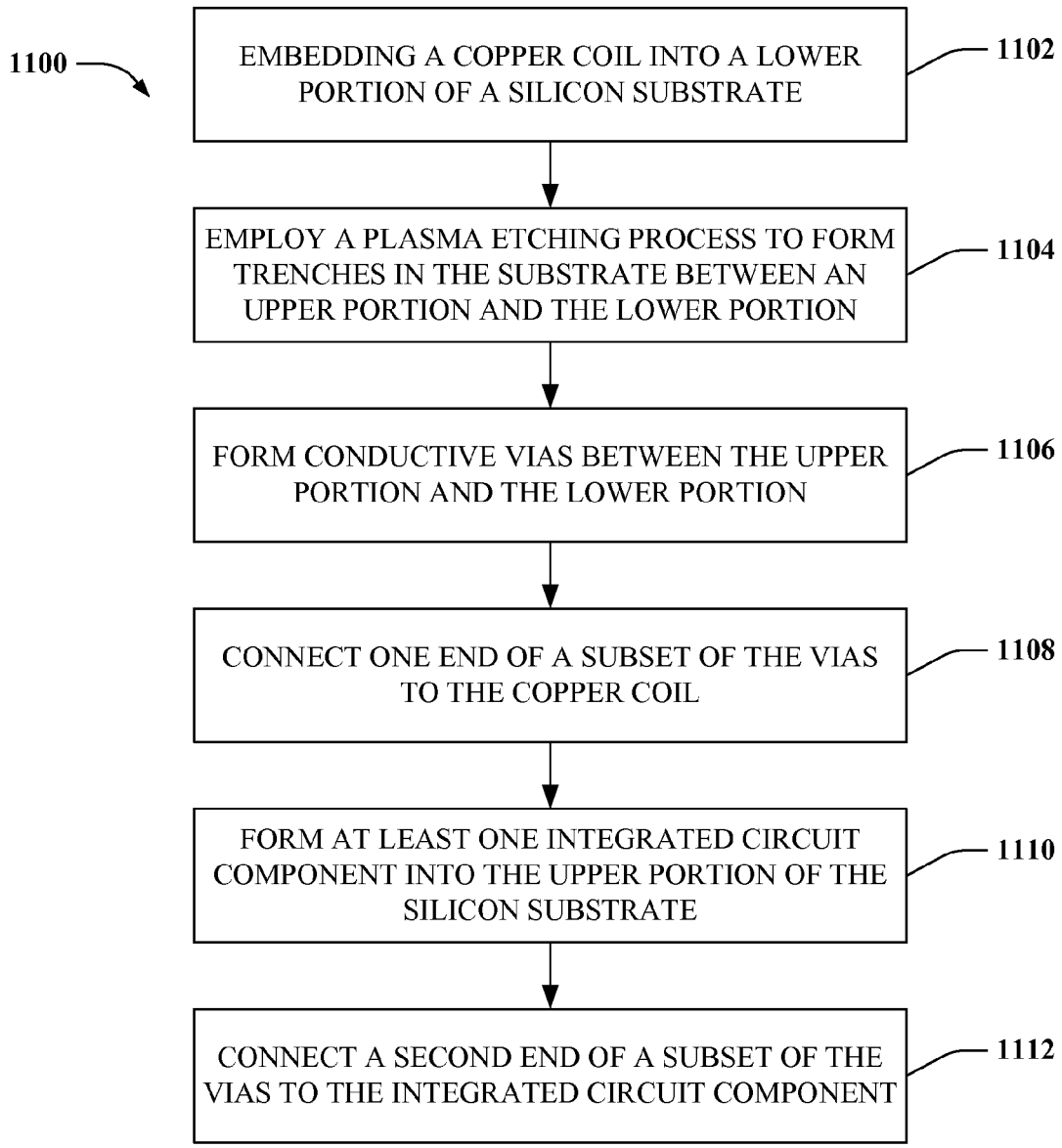
FIG. 11 illustrates a flowchart of a further example method for fabricating a monolithic embedded coreless magnetic inductor, according to other aspects.

In view of the exemplary diagrams described supra, process methods that can be implemented in accordance with the disclosed subject matter will be better appreciated with reference to the flow charts of FIGS. 10 and 11. While for purposes of simplicity of explanation, the methods 1000, 1100 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods 1000, 1100 described hereinafter. Additionally, it should be further appreciated that the methods 1000, 1100 disclosed hereinafter and throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 10 illustrates a flowchart of a sample method 1000 for fabricating a monolithic magnetic inductor according to further aspects of the subject disclosure. At 1002, method 1000 can comprise embedding a conductive coil in a lower portion of a silicon substrate. In a particular aspect, the conductive coil can have a thickness at least of about 50 μm. In other aspects, the conductive coil can comprise a copper conductor, copper alloy, or copper derivative.

At 1004, method 1000 can comprise opening a set of conductive vias within an upper portion of the silicon substrate. In one instance, the conductive vias can extend through a top surface of the silicon substrate. In another instance, the conductive vias can extend within the upper portion but short of the top surface, leaving the top surface continuous and unbroken.

At 1006, method 1000 can comprise electrically connecting at least a subset of the set of conductive vias and the conducting coil. By electrically connecting the conducting coil and one or more vias, connectivity can be provided between the lower portion and the upper portion of the silicon substrate.

FIG. 11 depicts a flowchart of an example method 1100 according to still other aspects of the subject disclosure. At 1102, method 1100 can comprise embedding a copper coil into a lower portion of a silicon substrate. At 1104, method 1100 can comprise employing a plasma etching process to form trenches in the substrate between an upper portion and the lower portion. At 1106, method 1100 can comprise forming conductive vias between the upper portion and the lower portion, by depositing conductive material within the trenches. At 1108, method 1100 can comprise connecting one end of a subset of the vias to the copper coil. At 1110, method 1100 can comprise forming at least one integrated circuit component into an upper portion of the silicon substrate. At 1112, method 1100 can comprise connecting a second end of a subset of the vias to the integrated circuit component.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the appended claims. Furthermore, to the extent that the term "includes" "has" or "having" are used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations for fabricating a circuit device. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments include a system as well as a computer-readable medium having computer-executable instructions for performing the acts and/or events of the various processes. In addition, while a particular feature may have been disclosed with respect to only one of several implementations, such feature may be combined with one or more other features of the other implementations as may be desired and advantageous for any given or particular application.

What is claimed is:

1. A magnetic induction device for an integrated circuit, comprising:
  a semiconductor substrate having a first surface, and a second surface opposite the first surface, wherein a distance from the first surface to the second surface is equal to a thickness of the semiconductor substrate;
  a conducting coil that forms a set of turns embedded within the semiconductor substrate and that extends from the first surface to a first depth within the semiconductor substrate that is less than the thickness of the semiconductor substrate; and
  one or more conductive vias, that substantially fills one or more respective holes in the semiconductor substrate, and that extends from the second surface to the first depth, a first end of at least one of the one or more conductive vias being embedded within the semiconductor substrate at the first depth and in physical contact with the conducting coil, to a second end at the second surface of the semiconductor substrate; wherein the set of turns embedded within the semiconductor substrate formed by the conductive coil is exclusive of the one or more conductive vias.

2. The magnetic induction device of claim 1, further comprising one or more integrated circuit (IC) components formed at least in part within or above the second surface of the semiconductor substrate, wherein the at least one of the one or more conductive vias electrically connects the conducting coil at a first end of the at least one of the one or more conductive vias with at least a subset of the one or more IC components at a second end of the at least one of the one or more conductive vias.

3. The magnetic induction device of claim 2, the magnetic induction device is a monolithic device and the conducting coil, one or more conductive vias and one or more IC components are embedded substantially within the semiconductor substrate.

4. The magnetic induction device of claim 1, the conducting coil has a thickness of about 200 micrometers (μm).

5. The magnetic induction device of claim 1, the conducting coil has a thickness of greater than 100 μm.

6. The magnetic induction device of claim 1, the semiconductor substrate is comprised of silicon.

7. The magnetic induction device of claim 1, further comprising an insulating layer between the conducting coil and an IC component at least in part on or above the second surface, or between the conducting coil and the semiconductor substrate.

8. The magnetic induction device of claim 7, the insulating layer is formed with a complementary metal oxide semiconductor (CMOS) compatible deposition process.

9. The magnetic induction device of claim 1, the conducting coil has a DC resistance of about 100 milliohms or less.

10. The magnetic induction device of claim 1, the conducting coil has a quality factor of about 3.9 at 100 megahertz.

11. The magnetic induction device of claim 1, the one or more conductive vias is formed with a batch formation process.

12. The magnetic induction device of claim 1, the one or more conductive vias is formed with a plasma etching process.

13. The magnetic induction device of claim 1, the semiconductor substrate having a thickness greater than 200 micrometers (μm).

14. The magnetic induction device of claim 1, the semiconductor substrate having an area about 1 square millimeter or less.

15. The magnetic induction device of claim 1, having an inductor efficiency of about 90 percent or greater.

16. The magnetic induction device of claim 1, the conducting coil having a current capacity of at least about 0.5 amps.

17. The magnetic induction device of claim 1, having no magnetic core.

18. The magnetic induction device of claim 1, having an operating frequency of about 100 megahertz or less.

19. The magnetic induction device of claim 1, the conducting coil comprising copper metal and having:
  a radius of about 450 μm;
  7 turns;
  a coil thickness of about 200 μm;
  a track width of about 30 μm;
  a track spacing between coil turns of about 15 μm; and
  a width of the via of about 10 μm.

20. The magnetic induction device of claim 19, having a DC resistance of about 87 milliohms at an operating current of about 100 milliamps, and a DC resistance of about 96 milliohms at an operating current of about 2 amps.

21. The magnetic induction device of claim 1, the conducting coil comprising copper metal and having:
  a coil thickness of about 100 μm;
  a track width of about 15 μm;
  a track spacing between coil turns of about 10 μm; and
  a width of the via of about 30 μm.

22. The magnetic induction device of claim 21, the conducting coil further having:
  a radius of about 330 μm; and
  2 turns.

23. The magnetic induction device of claim 22, having primary DC resistance of about 105 milliohms and secondary DC resistance of about 110 milliohms.

24. The magnetic induction device of claim 21, the conducting coil further having:
  a radius of about 700 μm; and
  5 turns.

25. The magnetic induction device of claim 24, wherein the magnetic induction device is a two-phase coupled inductor or a monolithic transformer having primary DC resistance of about 0.44 ohms and secondary DC resistance of about 0.45 ohms.

26. A monolithic magnetic induction device, comprising:
  a silicon substrate having a top surface and a thickness of at least 300 μm, a surface area of about 1 square millimeter or less, a wafer resistivity of greater than about 6 ohm-centimeters;
  a copper coil within the silicon substrate having a thickness greater than about 50 μm and less than 300 μm, a radius of less than about 700 μm, a track width below about 30 μm, a track spacing below about 15 μm, between 2 and about 7 turns, and an insulation layer between at least 2 of the turns providing an isolation thickness of about 3 μm or greater;
  an integrated circuit (IC) component formed at least in part on the top surface or within the silicon substrate; and
  at least one via that substantially fills one or more respective holes that extends through a portion of the silicon substrate and electrically connects at least a part of the IC component and at least a part of the copper coil.

27. The monolithic magnetic induction device of claim 26, wherein the IC component overlies the copper coil in a cross-section.

28. The monolithic magnetic induction device of claim 26, the copper coil formed at least in part from a set of trench lines generating between 2 and about 7 turns.

29. The monolithic magnetic induction device of claim 26, the copper coil formed at least in part from a set of trench lines are formed with an etching process and filled with copper material post-etch.

30. The monolithic magnetic induction device of claim 29, wherein a copper electroplating process is utilized to fill the set of trench lines with the copper.

31. The monolithic magnetic induction device of claim 30, wherein the silicon substrate serves as a molding material layer for the copper electroplating process.

32. The monolithic magnetic induction device of claim 26, the copper coil being formed from a single patterned metal layer.

33. The monolithic magnetic induction device of claim 26, the IC component is formed at least in part on or above a top exterior surface of the silicon substrate.

34. The monolithic magnetic induction device of claim 26, the copper coil comprising a magnetic flux in a direction substantially parallel to a normal vector of the top exterior surface.

35. The monolithic magnetic induction device of claim 26, the copper coil comprising a non-metallic core.

36. The monolithic magnetic induction device of claim 26, the non-metallic core being silicon.

37. The monolithic magnetic induction device of claim 26, comprising an operating frequency of about 100 megahertz or less.

38. The monolithic magnetic induction device of claim 26, the copper coil having a current capacity of at least about 0.5 amps.

39. The monolithic magnetic induction device of claim 26, comprising an inductor efficiency of about 90 percent or greater.

40. The monolithic magnetic induction device of claim 26, the copper coil has a DC resistance of about 100 milliohms or less.

41. The monolithic magnetic induction device of claim 26, the copper coil has a quality factor of about 3.9 at 100 megahertz.

* * * * *